TWIST-COMPRESSION BONDING OF METALLIC AND METALLIZED SURFACES

Filed March 22, 1957 2 Sheets-Sheet 1

INVENTORS: O. L. ANDERSON
P. ANDREATCH. JR.
H. CHRISTENSEN
BY H. O. Wright
ATTORNEY INVENTORS: O.L. ANDERSON
P. ANDREATCH, JR.
H. CHRISTENSEN
BY H. O. Wright
ATTORNEY United States Patent Office 3,006,068 Patented Oct. 31, 1961

3,006,068

TWIST-COMPRESSION BONDING OF METALLIC AND METALLIZED SURFACES

Orson L. Anderson, Summit, Peter Andreatch, Jr., South Plainfield, and Howard Christensen, Springfield, N.J., assignors to Bell Telephone Laboratories, Incorporated, New York, N.Y., a corporation of New York Filed Mar. 22, 1957, Ser. No. 647,886
6 Claims. (Cl. 29—470.1)

This invention relates to a process and apparatus for bonding two metallic objects or a metallic and a metallized object together.

A principal object of the invention is, accordingly, to facilitate the connection of electrical lead wires to terminal surfaces and electrodes, without appreciably increasing the temperature of the surface or electrode.

Another principal object of the invention is to facilitate the bonding of metal objects together.

A still further principal object is to facilitate the bonding of small conductive lead wires to accurately located metallized surface areas of semiconductive elements, ferroelectric elements, and the like, without disturbing the electrical or mechanical characteristics of the element.

In the communication art, and especially in the field of electronics as related to ferroelectric and semi-conductive devices, it is necessary to attach electrical leads to terminals or terminal surfaces in such a manner that a mechanically strong and durable bond affording a dependable electrical connection of negligible impedance is assured.

In view of the rapid strides being made toward the utilization of ever higher microwave frequencies and the heavy emphasis upon miniaturization of apparatus, conductor and terminal surface sizes of virtually microscopic proportions are being proposed for a multitude of uses.

The widespread use of small ferroelectric and semiconductive devices adds further emphasis to miniaturization and in addition raises the problem of effecting mechanically strong, durable bonds of small cross-sectional area and good electrical properties without disarranging or decreasing the remanent polarization of the ferroelectric elements or creating additional dislocations or disturbing existing dislocations in the very small elements of semiconductive material appropriate for use at very high micro-wave frequencies.

Bonds of the present invention between two metallic surfaces are based upon the discovery that the combination of appreciable pressure with a slow reversing twist, or reversing, purely rotating, motion of one surface with respect to the other, through a small angle in the order of ten to twenty degrees, at a rate in the order of only a complete twist cycle, or oscillation, per second, substantially devoid of rectilinear components, will effect a strong bond between reasonably clean and grease-free metallic surfaces or between clean metallic and metallized surfaces at normal room temperatures within a time interval as short as a few seconds. The rotational motion is then discontinued and the pressure is released.

For bonding to a particular area of a nonmetallic element, it is merely necessary to apply a metallic coating to the area as by electroplating, depositing in a vacuum, and painting with metallic paint, or the like, as is well understood by those skilled in the art.

Experiments in which simple unidirectional rotation was substituted for the reversing twist, or reversing rotational motion, produced only an occasional mechanically strong bond and even then the electrical resistance of the bond was usually much higher than for bonds made with the reversing twist rotation. The use of the reversing twist rotation would therefore appear to be virtually essential for making good electrical connection and much more preferable for making a mechanically strong bond.

The pressure required is substantially less than that required for "cold-welding," as taught by the prior art, since many metals will form strong bonds of the invention with pressures causing only slight deformation adjacent the bonded surfaces. "Cold-welding" processes of the prior art require sufficient pressure to produce a deformation of from fifty to eighty percent, or more. It should here be noted that the forces required to produce a "cold weld" are such that a very considerable amount of heat is actually generated in the weld. Indeed, it is no exaggeration to characterize a "cold weld" as a species of hot weld in which heat sufficient to cause melting of the surfaces being welded is supplied by the crushing power applied in making the weld.

The twisting motion required for making bonds of the invention is relatively very slow and of such limited duration that no appreciable heating of the bonded surfaces from mechanical friction can be detected, nor could any appreciable heating reasonably be expected to occur. As mentioned above, the twisting or rotational motion of one surface with respect to the other must reverse, i.e. be alternately clockwise and counterclockwise, or vice versa, through an angle of from ten to twenty degrees. A "cycle" or "oscillation" of this motion is defined for the purposees of this application and its appended claims as a rotation in one direction followed by a rotation of substantially equal angle in the reverse direction.

The difficulties arising from the heating effects incident to "cold-welding," hot-welding and soldering operations are not encountered in bonding effected by the method of the present invention.

More particularly, in bonding a lead to a semi-conductive element (metallized area thereon), in accordance with the present invention, existing dislocations are not disturbed and no new dislocations are created.

Also, the method of the invention, requiring and causing no appreciable heating of the bonded area, is of great value in connection with the provision of electrodes and the attaching of leads to transducers and memory elements of barium titanate, and the like, since any appreciable heating may remove or decrease the essential remanent polarization of the element.

Heretofore, because of the appreciable heating required with or resulting from practically all prior art bonds or welds, it has been necessary to employ silver paste electrodes and silver soldered leads on these memory elements and transducers. As is well known to those skilled in the art, silver electrodes on barium titanate and similar materials exhibit non-ohmic properties which are not desirable. The method of the present invention permits one to use other conductive electrode materials such as gold, platinum, aluminum, or the like, for the electrodes and leads of transducers or memory elements of barium titanate, and the like, and thus makes feasible the manufacture of such devices of substantially superior operating characteristics.

Conductive wires as large as one-quarter inch in diameter and as small as a fraction of a mil in diameter have been successfully bonded in accordance with the process of the invention. Likewise, conductive leads of a fraction of a mill in diameter have been successfully bonded to minute-area, metallized, or alloyed, surfaces or strips on semiconductive elements of silicon and germanium, or on elements of barium titanate, and the like, without in any way disturbing the mechanical or electrical properties or the remanent polarization of the elements.

While of great interest at present for bonding small leads to minute elements, bonds of the invention are also of very substantial interest for bonding much larger metal members together.

Stripping tests of properly made bonds of the invention usually result in fracture of the lead or element at an area definitely removed from the bonded area, indicating that the bond is normally stronger than the bonded objects. For the purposes of this application, including the appended claims, the term "strong bond" is to be understood to mean a bond in which the bonded area will usually withstand greater tension and/or shear than the elements joined by the bond.

Other features, objects and advantages of the invention will become apparent in connection with the following detailed description of illustrative bonds and arrangements for practicing the invention, and from the appended claims.

Figure 1:
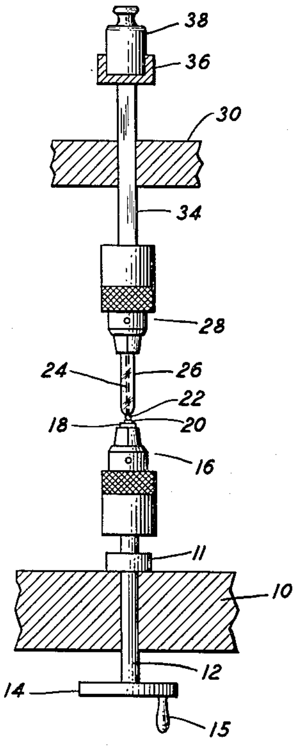
FIG. 1 illustrates a simplified arrangement for effecting the twist compression bonding of a small metallic lead to a metallized area on a minute semiconductor element in accordance with the principles of the present invention.

In more detail in FIG. 1, a first vertical shaft 12 of circular cross section having an enlarged shoulder portion 11 is supported in fixed rigid bearing 10, as shown. Bearing 10 and shaft 12 are accurately fitted and aligned to afford precise rotation about the longitudinal axis of shaft 12. Bearing 10 is further designed to absorb the downward thrust of shoulder 11 of shaft 12. The upper end of shaft 12 is provided with a precision work-holder or chuck 16 adapted to hold relatively small work pieces so that a predetermined point of the upper surface of the work piece can be held on the longitudinal axis of the vertical shaft 12. Arrangements of numerous forms for offsetting the work piece to bring any desired point of the upper surface of the work piece into alignment on the axis of shaft 12 are well known to those skilled in the art and are, accordingly, not illustrated in the present application.

For extremely accurate work, devices well known in the art and designated micromanipulators can, obviously, be employed to advantage in conjunction with a microscope for accurate observation of the precise alignment obtained. Since such devices and techniques are well understood and widely employed by those skilled in this art, it is not deemed necessary to illustrate them or to further describe their use.

A handwheel 14 on the lower end of shaft 12 permits slow rotation by handle 15 in either direction, or alternate rotation in clockwise and counterclockwise directions, as will be described in more detail hereinunder. Arrangements utilizing a motor drive with appropriate speed reduction gears and a crank mechanism to periodically reverse the direction of rotation through any chosen arc are, of course, also well known in the art and may, obviously, be substituted for manual operation. In general, such a power drive would be employed only where large pieces are to be bonded in accordance with the method of the invention.

An element 18 of semiconductive material, such as silicon or germanium, and having a small metallized area 20 on its upper surfaces is mounted in and firmly held by chuck 16 so that the upper surface of element 18 is horizontal and the center of area 20 is substantially coincident with the longitudinal axis of shaft 12. By way of example, for a high microwave frequency semiconductive element, element 18 may be .050 inch square by 5 mils thick and area 20 may be 3 mils square by .01 to 0.1 mil, or more, thick. Area 20 may be prepared in any of several ways well known to those skilled in the art, as, for example, by evaporating a metallic coating in a vacuum, or by electroplating. Such areas may be heated if it is desired to produce alloying. In any event, the surfaces to be bonded should be at substantially room temperature when the bonding process is initiated. The metal employed in forming area 20 may be, for example, gold or aluminum, or the like, as discussed above and in the copending joint application of applicants Anderson and Christensen, Serial No. 619,639, filed October 31, 1956.

In the illustration of FIG. 1 of the present application, a fine wire 24 of, for example, gold or aluminum, or other metal, depending, as is well known to those skilled in the art, upon the nature of the area 20 and the specific characteristics of the semiconductive device desired, is supported in a capillary tube 26 to lend sufficient mechanical rigidity and to avoid subjecting wire 24 to torsion, since wire 24 may be, for example, only five-tenths of a mil in diameter. Wire 24 preferably terminates at its lower end in an enlarged portion 22 of approximately spherical shape, formed on it by heating, the spherical portion 22 having a diameter at least twice that of the wire 24. This type of lead and terminal portion will be discussed with more particularity in connection with FIG. 2 hereinunder.

Capillary tube 26 should have a longitudinal hole through it sufficiently large to admit wire 24 readily but of appreciably smaller diameter than portion 22. For example, for the diameters suggested above, the hole through capillary tube 26 is suitably eight-tenths mil in diameter.

Capillary tube 26 is held in precision work-holder or chuck 28, which in turn is attached to the square shaft 34. The square shaft 34 is accurately maintained by square bore bearing 30 in vertical alignment on a common longitudinal center line with the previously described round shaft 12 but may move freely vertically along said common longitudinal center line. A pan 36 in which a weight 38 can be placed is attached to the upper end of shaft 34.

The overall assembly is, obviously, arranged to hold the spherical portion 22 of wire 24 on the center point of area 20 of element 18 with a pressure determined by the combined weight of the shaft 34 and all members carried by the shaft 34 (i.e. chuck 28, tube 26, wire 24, pan 36, and weight 38). The square bore bearing 30, as previously stated, permits vertical movement of the square shaft 34 but prevents rotation of said shaft. It should be noted, however, that only friction between capillary tube 26 and the enlarged end 22 of lead wire 24 holds the end 22 from turning. The purpose of this feature will be discussed hereinunder.

Weight 38 is chosen so that the pressure exerted upon the portion 22 will cause it to become deformed or flattened (five to twenty-five percent, the required amount of deformation depending upon the hardness of the material) at its lower surface, as will be discussed in more detail in connection with FIG. 3 hereinunder. For example, with a soft metal like gold, a pressure in the order of approximately 15,000 pounds per square inch will result in a deformation of approximately twenty-five percent and a strong bond. The criterion for determining the pressure is that perceptible, but not more than approximately twenty-five percent, deformation should take place immediately adjacent the bond in at least one of the two elements being bonded together. When a handwheel is employed to twist one surface with respect to the other, the pressure should be increased in small increments until there is a definite "feel" that the surfaces are "biting into" each other.

The handwheel 14 should be rotated in alternately reverse directions (i.e. cycled or oscillated) through an angle of approximately ten to twenty degrees at a rate of approximately one cycle, or oscillation, per second for a period of several seconds, while the pressure mentioned just above is being maintained. Stated in another way, at least two twist cycles, or oscillations, for small leads and six or more for bonding larger surfaces are normally required. Rotation, or oscillation, is then stopped, the weight 38 is removed from the pan 36, and the head 22 will be found to be strongly bonded to the metallized area 20 of semiconductive element 18. For any specific bonding process, a few test bonds should be made to determine the number of twist cycles or oscillations necessary to produce a strong bond, since it is obvious that twisting after a strong bond has been effected may result in mechanical damage to one of the bonded objects. For example, instances of tearing the metallized coating from a semiconductive element or the breaking of a fine metallic conductor have been encountered. Damage from too long continued twisting can be largely eliminated by including frictional "clutching" means of sufficient strength to support relative rotational movement between the members as long as a strong bond has not been formed, but capable of slipping when the surfaces seize in a bond, without damaging either of the objects being bonded. In the arrangement of FIG. 1, for example, the capillary tube 26 permits head 22 to turn by slipping if a strong bond is formed prior to discontinuing the twisting motion.

Figure 2:
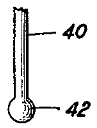
FIG. 2 is a more detailed showing of a very small metal lead wire particularly well adapted for use in the making of a bond to a metallized surface of a semiconductive or ferroelectric element with the arrangement exemplified in FIG. 1.

FIG. 2 illustrates to a greatly enlarged scale a thin wire 40, for example, of diameter .0005 inch, the lower end of which has been heated to its melting point so that a small spherical portion 42 is formed (by surface tension of the molten metal) on the end of the wire, the diameter of portion 42 being, by way of example, .0010 inch. The assembly is then cooled to room temperature.

When intended for use as a lead wire for connecting to a metallized area on a semiconductive element, as described in detail above in connection with FIG. 1, wire 40 may be, for example, of gold, very pure platinum, silver, or the like, depending, as is well understood by those skilled in the art, upon the specific character of the semiconductive element which it is desired to fabricate. Aluminum can be used provided it is processed in a non-oxidizing atmosphere to avoid excessive oxidation.

Figure 3:
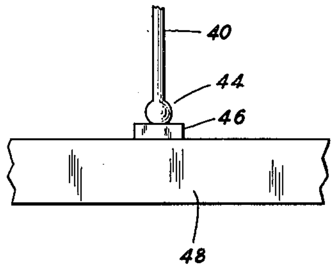
FIG. 3 is a diagrammatic representation of a bond of the invention.

FIG. 3 illustrates to a greatly enlarged scale the bond of the portion 44 of wire 40 of FIG. 3 to a metallized area 46 on a small element 48 of semiconductive material, such as germanium or silicon, when bonded in accordance with the principles of the invention, as exemplified in the detailed description given above in connection with FIG. 1. Representative dimensions of member 48 for high microwave frequency use are .050 inch square by .005 inch thick. Metallized area 46 can be, for example, 3 mils square by .01 to 0.1 mil, or more, thick. It can comprise a layer of metal, such as gold, aluminum, silver, or the like, which can, for example, be evaporated in a vacuum upon the surface through an appropriate mask. Preferably the metal, forming area 46, is alloyed with the surface of the semiconductive element 48 by heating to the eutectic temperature for the combination of metal and semiconductive material being used and holding the element at the eutectic temperature for a second or so, after which it is cooled to room temperature. Head 44 is, by way of typical example, compressed by from five to twenty-five percent in making the bond, depending upon the metals being bonded.

For connecting larger leads to each other or to the surface of a metal terminal, it is merely necessary to bring the areas to be bonded together under a sufficient pressure to produce a deformation within the above noted range, hold one surface fixed and reversibly rotate the other to cycle or oscillate through an angle of from ten to twenty degrees several times, for example four to six times, at a rate of approximately one oscillation or cycle per second, while maintaining the above-mentioned pressure. Frictional clutching means, which will slip if excessive torsion tends to build up between the members to be bonded, is preferably provided. This clutching means should also, preferably, be adjusted to support various maximum torsional forces before slipping as various torsional forces may be required depending upon the areas and materials to be bonded. This clutching means is, as mentioned above, preferably included so that the elements will not be damaged in the event that a strong bond forms before the rotational motion has been discontinued. In every instance the rotational motion should be discontinued before the pressure is released.

As noted above, a pressure of approximately 15,000 pounds per square inch is suitable for bonding gold. Other metals, such as steel, have been found to require quite different pressures. The proper pressure for any specific combination of metals can be arrived at by gradually increasing the pressure until signs of "biting in" or "sticking" of the surfaces is observed, either by tactile or visual inspection of the operation.

A high precision lathe, or similar machine, can readily be adapted for making bonds of the invention, in lieu of the arrangement illustrated in FIG. 1, as will be apparent to those skilled in the art. An essential requirement is that the relative motion between the surfaces to be bonded be virtually a pure reversing rotating motion with substantially no rectilinear components. Obviously, either surface may be rotated and the other held stationary.

Figure 4:
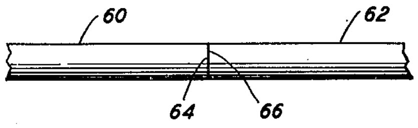
FIG. 4 is a further diagrammatic representation of a bond of the invention.

FIG. 4 illustrates a bond of the invention made, as hereinabove described, between two copper conductors or copper rods, 60 and 62, each of one-quarter inch diameter, their end surfaces 64 and 66, respectively, having been pressed together, with a pressure sufficient to produce a perceptible deformation immediately adjacent the bond, while one was reversibly twisted or rotatively cycled or oscillated through an arc of approximately twenty degrees with respect to the other through three to six oscillations or cycles for approximately three to six seconds, respectively, after which the pressure was released and the surfaces 64 and 66 were then firmly bonded to each other.

Figure 5:
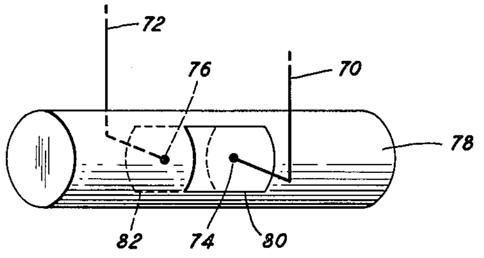
FIG. 5 illustrates a transducer of barium titanate the leads to which are attached to the electrodes by bonds of the invention.

FIG. 5 illustrates an electromechanical transducer, comprising a solid cylinder 78 of barium titanate, or a similar ferroelectric material, having centrally disposed front and rear metallic electrodes 80 and 82 on its front and rear sides, respectively, as shown. Cylinder 78 is, for example, bidirectionally and longitudinally polarized, as taught in Patent 2,742,614, granted April 17, 1956, to W. P. Mason, assignor to applicants' assignee (see FIG. 2 of the patent). Leads 70 and 72 are bonded, in accordance with the method of the present invention, to electrodes 80 and 82, respectively, as shown.

Since the bonding method of the present invention has no tendency to disarrange or decrease the remanent polarization of the ferroelectric member 78, the connection of leads 70, 72 to electrodes 80, 82, respectively, will not disturb the polarization of cylinder 78. Use of the bonding method of the present invention in connecting leads to ferroelectric transducers makes it entirely practicable to employ electrodes of substantially any conveniently usable metal and thus makes unnecessary a restriction to silver electrodes as it frequently required, for example, in prior art soldering practices. In general, copper and silver are less desirable for use directly in contact with semiconductive or ferroelectric elements for reasons well known to those skilled in the art.

Figure 6:
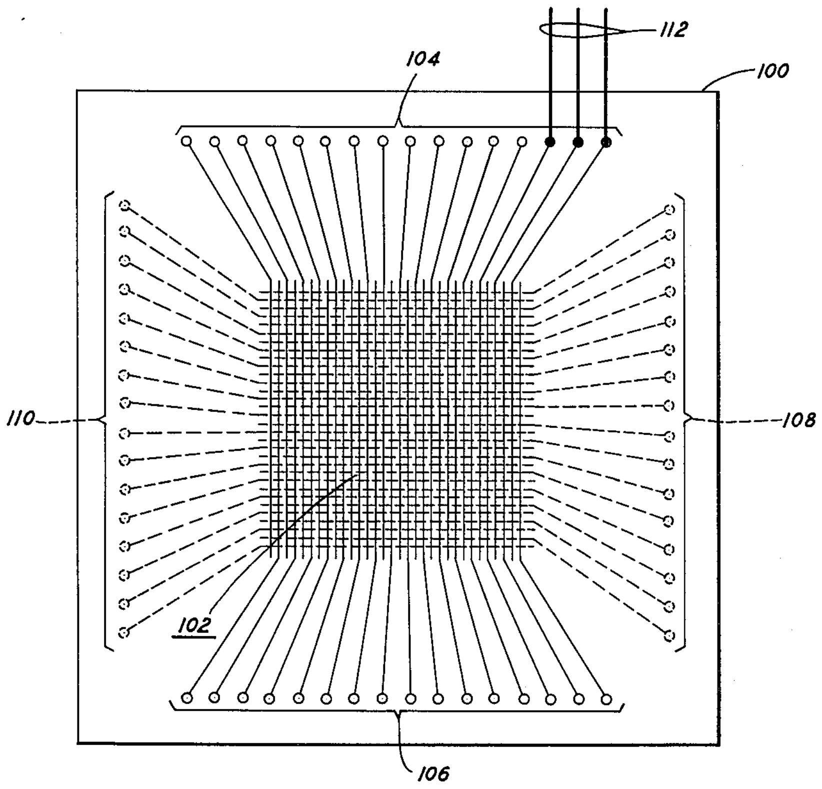
FIG. 6 illustrates a memory matrix of barium titanate the leads to which can conveniently be attached to the terminals by bonds of the invention.

FIG. 6 illustrates to a greatly enlarged scale a matrix 102, positioned centrally on a single crystal 100 of barium titanate, or similar ferroelectric material. Crystal 100 may actually be, by way of typical example, fivesixteenth inch square and 5 mils thick and matrix portion 102 may then be one-eighth inch square.

On the front surface of the matrix portion 102, thirty-two, fine, closely spaced, vertical, conductive lines are deposited, preferably by a photochemical process such as is described, for example, in the copending application of J. Andrus, Serial No. 537,455, filed September 29, 1955, now abandoned. Alternate ones of these vertical lines are connected by like, inclined conductive lines to successive ones of the group of sixteen conductive terminal spots 104, respectively, at the top edge of the crystal 100, and the remaining vertical lines are similarly connected to the group of sixteen conductive terminal spots 106, respectively, at the bottom edge of the crystal 100, all as shown in FIG. 6. The conductive terminal spots and inclined lines connecting them to the lines of matrix 102 are also preferably deposited as taught in the above-mentioned Andrus application.

A similar arrangement of lines and terminals is placed, with a rotation of ninety degrees, on the rear surface of crystal 100, there being thirty-two horizontal lines, half of which (alternate lines) are connected to the group of sixteen terminal spots 108 at the right side of crystal 100 and the remaining lines to the group of sixteen terminal spots at the left side of crystal 100, all as shown in FIG. 6.

The arrangement of FIG. 6, as just described, provides a matrix of minute size for the storage and reading out of 256 bits of information in accordance with principles well understood in the electronic computing art concerned.

For the purposes of the present invention, the feature of particular interest, obviously, is that a very fine connecting lead must be attached to each of the terminal spots in the groups 104, 106, 108 and 110. Leads 112 represent leads connecting to terminal spots, the connections being made by bonding in accordance with the method of the present invention. Again the fact that bonds of the present invention can be made at room temperature and cause no appreciable heating at the bond enables the connections to be made, literally by the score, without in the least disturbing the electrical properties or polarization of the barium titanate or similar ferroelectric element.

It should be noted that the use of a headed wire for very small leads, as shown, for example, in FIG. 2, greatly simplifies the problem of pressing the end of the wire against the area to which it is to be bonded.

The heating of the end of the wire to form the ball or spherical portion thereon thoroughly anneals the metal and removes internal stresses, as well as tending to bring impurities to the surface where they can be readily removed. This form of head furthermore facilitates determination of the actual contact area between the flattened spherical head and the surface, since the diameter of the head-to-surface contact is readily measured (using a microscope when very small leads are employed).

Experimental measurement has demonstrated that the electrical resistance of a joint between a small conductor with an annealed ball end and a flat metal terminal surface, being bonded in accordnace with the method of the invention, starts at an initially relatively high value, decreasing at an appreciable slope and linearly on a double logarithmic scale, as successive twist cycles of the bonding process are carried out. The contact area between the head and the surface, of course, increases as a result of flattening of the head under pressure. After a sufficient number of twist cycles, or oscillations, however, an abrupt and substantially instantaneous drop in the electrical resistance of the bond takes place, and thereafter the resistance follows a much lower, more slowly decreasing, linear curve (log-log). This indicates that the pure cyclic twisting motion between the surfaces to be bonded together must break up and/or remove some sort of "film" which inhibits the bonding of the surfaces together. In some instances two or more abrupt, but more limited, decreases in resistance have been observed before the final lowest resistance curve is reached, indicating, possibly, a breaking up and/or removal of the "film" (if it is a "film") by parts or sections as the twisting under pressure is continued. Once the "film" is fully broken up and/or removed, the twisting motion can be discontinued, the pressure released, and the surfaces will be found to be firmly bonded together. It is not positively known, nor immediately apparent, precisely what action takes place in the forming of the bond. If in fact a "film" is broken down so that the atoms are enabled to seize each other, it seems highly probable that at least a considerable portion of the "film" must remain in the bonded area as fragments interspersed between the atoms of the bond. It appears to be essential that the areas to be bonded be maintained continuously in contact and under suitable pressure until the bond has been effected. For example, if the rotating motion is about a point appreciably removed from the center point of the area of contact, no bond, or at best only a partial and weak bond, between the surfaces is obtained. From this, it seems obvious that one of the surfaces should preferably be of substantially circular contour so that rotation about the normal to its center point will result in continuous contact throughout the entire common contact area beween the two objects which are to be bonded together. The necessity of applying sufficient pressure to produce at least moderate deformation adjacent the area to be bonded suggests that a further element of the phenomenon may be a physical stressing of the atomic structures involved.

While flat surfaces at the bonded area have been assumed for purposes of simplicity throughout the specification, it is obvious that closely fitting conical surfaces or other surfaces of revolution centered with respect to the axis about which rotation is to take place may equally well be bonded together in accordance with the principles of the present invention.

Numerous and varied other arrangements and processes within the spirit and scope of the principles of the present invention will readily occur to those skilled in the art. No attempt has here been made to exhaustively illustrate all such possibilities.

What is claimed is:

1. A method of bonding a metallic conductor to a metallized surface area of a semiconductive or ferroelectric element to form a mechanically strong bond having negligible electrical resistance, the conductor and the metallized area each being of a metal from the class consisting of gold, silver, platinum, aluminum, copper and iron, said method comprising pressing the end of said conductor against said area with a pressure sufficient to produce a deformation of five to twenty-five percent at the end of the conductor, reversibly rotating one of the contacting surfaces between said conductor and said element through an angle of between ten and twenty degrees with respect to the other to produce a substantially pure reversing rotational movement with respect to the axis perpendicular to the center point of the surface area of contact between them, continuing said movement at a rate of approximately one cycle, or oscillation, per second while maintaining said pressure for an interval of at least two seconds, discontinuing said twisting movement, and releasing said pressure.

2. A method of bonding two metallic objects together to form a mechanically strong bond having negligible electrical resistance, the objects each being of a metal from the class consisting of gold, silver, platinum, aluminum, copper and iron, which comprises pressing a surface of one object against a surface of the other with a pressure sufficient to produce a deformation of five to twenty-five percent of at least one of said objects immediately adjacent the common surface of contact, reversibly twisting the surface of contact of one of said objects with respect to that of the other to produce substantially pure reversing rotary motion with respect to the axis perpendicular to the center of said surface of contact, said motion being at a rate in the order of one cycle, or oscillation, per second, continuing said operation for at least two seconds, discontinuing said twisting motion, and releasing the pressure.

3. A method of bonding at ambient temperature two metal objects together to form a mechanically strong bond having negligible electrical resistance, the objects each being of a metal from the class consisting of gold, silver, platinum, aluminum, copper and iron, which method comprises pressing one against the other with a pressure sufficient to produce a deformation of between five and twenty-five percent of at least one of the objects at its contacting surface and subjecting the surfaces of contact of the objects to purely rotational reversing motion of between ten and twenty degrees with respect to an axis perpendicular to the center point of the area of contact between the objects, increasing the pressure until biting in or sticking between the objects occurs and a strong bond is formed, discontinuing the motion, and releasing the pressure.

4. The method of claim 3 wherein the rotational reversing motion is imparted by frictional driving means whereby firm adherence between the objects will terminate the relative motion between them.

5. A method of bonding at ambient temperature a metal object to a metallized surface of a second object to form a mechanically strong bond having negligible electrical resistance, the metal object and the metallized surface each being of a metal from the class consisting of gold, silver, platinum, aluminum, copper and iron, which method comprises pressing the metal object against the metallized surface with pressure sufficient to produce a deformation of between five and twenty-five percent of said metal object at its contacting surface, subjecting the surfaces of contact of the objects to purely rotational reversing motion of between ten and twenty degrees with respect to an axis perpendicular to the center point of the area of contact between the objects, increasing the pressure until biting in or sticking between the objects occurs and a strong bond is formed, discontinuing the motion, and releasing the pressure.

6. The method of claim 5 wherein the rotational reversing motion is imparted by frictional driving means whereby firm adherence between the objects will terminate the relative motion between them.

References Cited in the file of this patent

UNITED STATES PATENTS

| | | |
|---|---|---|
| 1,624,501 | Nelson | Apr. 12, 1927 |
| 1,661,448 | Taylor | Mar. 6, 1928 |
| 2,662,500 | Fort et al. | Dec. 15, 1953 |
| 2,671,746 | Brew | Mar. 9, 1954 |
| 2,698,548 | Sowter | Jan. 4, 1955 |
| 2,739,369 | Cooney | Mar. 7, 1956 |
| 2,751,808 | MacDonald et al. | June 26, 1956 |
| 2,752,663 | White et al. | July 3, 1956 |
| 2,754,238 | Arenberg | July 10, 1956 |
| 2,795,039 | Hutchins | June 11, 1957 |

FOREIGN PATENTS

| | | |
|---|---|---|
| 711,742 | Great Britain | July 7, 1954 |